United States Patent [19]

Rabii

[11] Patent Number: 5,233,425
[45] Date of Patent: Aug. 3, 1993

[54] ADAPTIVE AFT SYSTEM WITH VARIABLE STEP RESOLUTION

[75] Inventor: Khosro M. Rabii, Arlington Heights, Ill.

[73] Assignee: Zenith Electronics Corporation, Glenview, Ill.

[21] Appl. No.: 782,037

[22] Filed: Oct. 24, 1991

[51] Int. Cl.$^5$ .............................................. H04N 5/50
[52] U.S. Cl. ............................... 358/195.1; 358/191.1; 455/184.1; 455/164.1; 455/182.2
[58] Field of Search ............... 358/191.1, 195.1, 193.1, 358/905; 455/164.1, 150.1, 177.1, 184.1, 182.2, 192.3

[56] References Cited
U.S. PATENT DOCUMENTS

| | | | |
|---|---|---|---|
| 4,241,450 | 12/1980 | Blatter et al. | 358/195.1 |
| 4,358,791 | 11/1982 | French | 358/195.1 |
| 4,422,096 | 12/1983 | Henderson | 358/195.1 |
| 4,564,862 | 1/1986 | Cohen | 358/905 |
| 4,575,761 | 3/1986 | Carlson et al. | 358/195.1 |
| 4,689,685 | 8/1987 | Testin et al. | 358/195.1 |
| 4,698,680 | 10/1987 | Lewis, Jr. et al. | 358/405 |

Primary Examiner—James J. Groody
Assistant Examiner—Jeffrey S. Murrell

[57] ABSTRACT

A frequency synthesis tuner for a television receiver includes a voltage controlled oscillator (VCO) responsive to a phase locked loop (PLL) for generating a local oscillator signal which is used to convert a received RF television signal to an intermediate frequency signal. An automatic fine tuning (AFT) detector develops an AFT error signal representing the frequency deviation of the converted signal from 45.75 MHz. Fine tuning is effected by controlling the reference and channel index dividers of the PLL in a coordinated manner in response to the AFT error signal for initially rapidly adjusting the frequency of the local oscillator signal to minimize the deviation of the converted signal from 45.75 MHz and then subsequently by further adjusting the frequency of the local oscillator signal in successive steps of adaptively increasing resolution. In one embodiment, the frequency of the local oscillator signal is adjusted in successive steps of adaptively increasing resolution as a function of the time rate of change of an autocorrelation signal developed in response to a received ghost cancellation reference (GCR) signal.

26 Claims, 3 Drawing Sheets

ADAPTIVE AFT SYSTEM WITH VARIABLE STEP RESOLUTION

BACKGROUND OF THE INVENTION

The present invention generally relates to automatic fine tuning (AFT) systems for television receivers and, more particularly, concerns an adaptive AFT system for use in a television receiver having a frequency synthesis tuner.

A conventional frequency synthesis tuner operates according to the expression:

$$fLo/N2^P = fref/M = Fref;$$

where $2^P$ represents the prescaler, N is a variable channel index which is related to the selected channel number and M is a fixed constant. Typically, fref=16 MHz and $M=2^{13}$, and therefore Fref=1953.125 Hz.

Automatic fine tuning (AFT) is normally performed by incrementing or decrementing channel index N in response to a zero-crossing of the AFT response. The step resolution in the AFT mode is therefore fixed at $2^P$ Fref, or 125 KHz. The maximum resolution with which the local oscillator can be tuned to the desired local oscillator frequency fLo is therefore ½ (125 KHz) or 62.5 KHz. This fixed resolution limits the accuracy with which a received signal may be recovered as well as the speed of carrier detection. For example, at a fixed step resolution of 125 KHz, the recovered signal may suffer undesired frequency ripple which could degrade the performance of certain signal processing circuits such as ghost cancellers, due to the use in such circuits of small tap coefficients for effecting spectral equalization. Also, this fixed step resolution adversely effects auto search circuits by requiring excessive time for carrier detection.

It is therefore an object of the present invention to overcome the foregoing deficiencies by providing a frequency synthesis tuning system in which the AFT step resolution is adaptively variable, with the step resolution being reduced from a maximum value to a minimum value as the frequency of the local oscillator fLo approaches the nominal frequency for tuning the received carrier. Tuner operation may thus be effected in a rapid and accurate manner by using a large step resolution when fLo is relatively far from the nominal frequency and using smaller values of step resolution as fLo approaches the nominal frequency. In a preferred embodiment the adaptive step resolution size is initially controlled by the AFT response and subsequently as fLo approaches the nominal frequency by the output of a ghost cancellation reference (GCR) correlator.

BRIEF DESCRIPTION OF THE DRAWINGS

These and other aspects and advantages of the invention will be apparent upon reading the following description in conjunction with the drawings, in which.

DESCRIPTION OF THE PREFERRED EMBODIMENTS

Before undertaking a detailed description of the invention, it may be useful to initially consider it in a general sense. As previously described, in prior art frequency synthesis tuning systems the reference frequency divisor M is a fixed constant while the local oscillator frequency divisor N (i.e. the channel index) is variable to allow for selective tuning of different channels. This limits tuning resolution in the AFT mode to a fixed value, typically 125 KHz.

According to the present invention, resolution in the AFT mode is adaptively controlled by varying both divisors M and N in a coordinated manner. For example, rapid carrier acquisition is achieved by using a relatively large value of AFT step resolution requiring a reduction in the value of divisor M which, in turn, necessitates a corresponding reduction in the value of divisor N. On the other hand, to achieve a finer step resolution, the value of divisor M must be increased, necessitating a corresponding increase in N. Consider the following examples for tuning channel 2 (i.e. fLo=101 MHz).

1) To achieve a step resolution of 125 KHz, $$M = 2^P fref/\text{step resolution} = 64\ (16\ MHz)/125\ KHz = 2^{13}$$

In this case, N is derived as follows:

$$N = M\ fLo/2^P fref = 2^{13}(101\ MHz)/64(16\ MHz) = 808,$$

2) To achieve a coarser step resolution of say 250 KHz, M and N must be reprogrammed as follows:

$$M = 64\ (16\ MHz)/250\ KHz = 2^{12}$$

$$N = 2^{12}\ (101\ MHz)/64\ (16\ MHz) = 404$$

3) To achieve a finer step resolution of say 62.5 KHz M and N must be reprogrammed as follows:

$$M = 64\ (16\ MHz)/62.5\ KHz = 2^{14}$$

$$M = 2^{14}\ (101\ MHz)/64\ (16\ MHz) = 1616$$

AFT step resolution may thereby be varied by suitably programming divisors M and N in a coordinated manner. As will be explained in further detail hereinafter, AFT step resolution is adeptively varied according to the invention by appropriately adjusting the values of M and N under the control of the AFT discriminator response and, if present, a GCR auto-correllation response.

Figure 1:
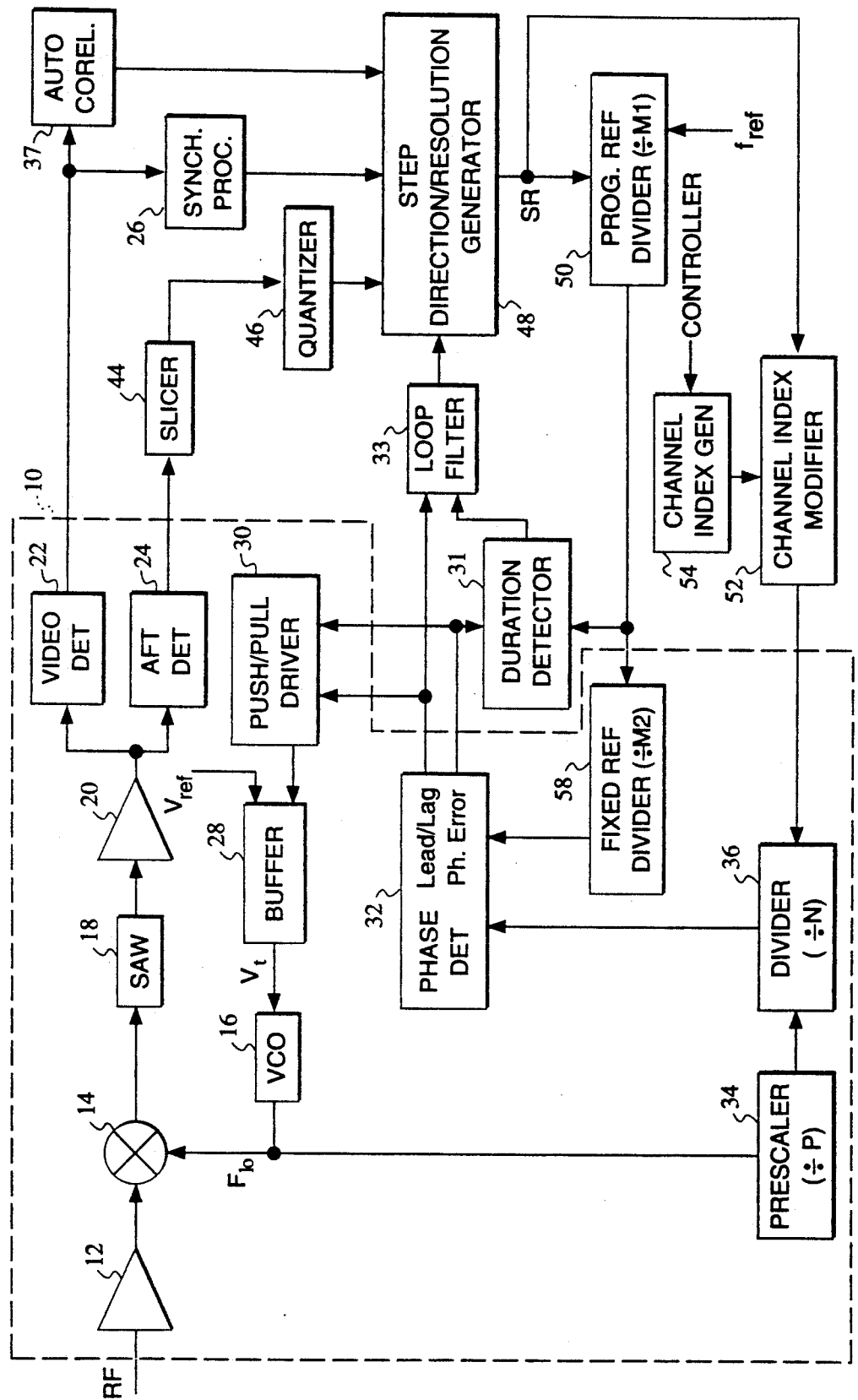
FIG. 1 is a block diagram of a frequency synthesis tuner incorporating the AFT system of the invention.
Figure 2:
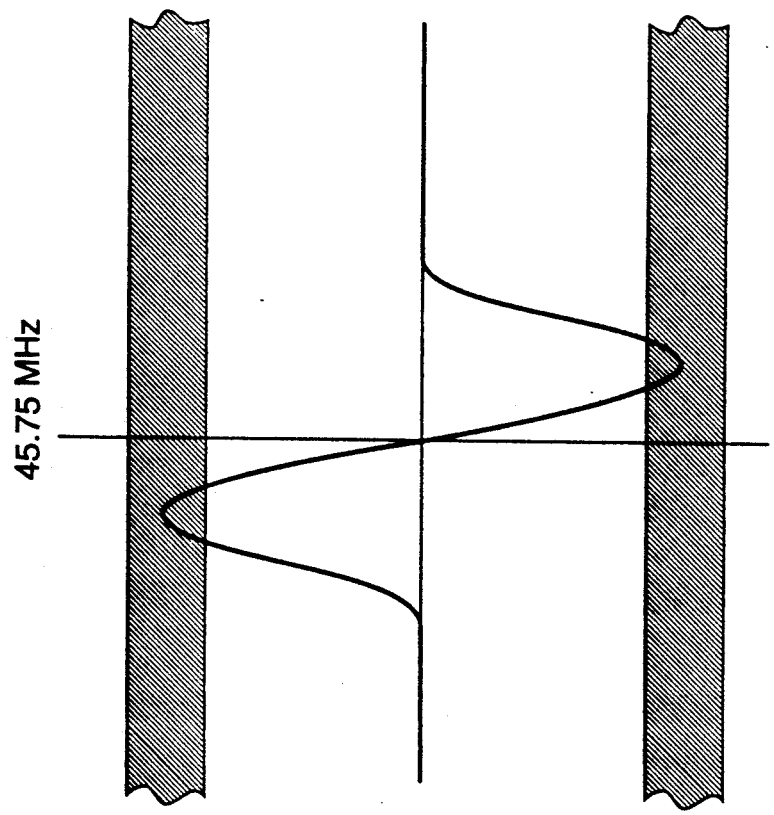
FIG. 2 illustrates the discriminator response of the AFT detector of the tuner of FIG. 1.

Referring to the block diagram of FIG. 1, reference numeral 10 represents the components of a conventional frequency synthesis tuning system. A received RF signal is amplified by a tuner amplifier 12 and converted to an IF frequency by heterodyning it in a mixer 14 with a signal from a local oscillator 16 having frequency fLo. The IF signal is processed by an IF SAW filter 18, amplified by an IF amplifier 20, and then applied to a video detector 22 and to an AFT detector 24. The output of the video detector 22 is a baseband video signal which is applied to a synch processor 26 as well as to a video processor preferably including a suitable ghost cancellation circuit (not shown). The output of AFT detector 24 is shown in FIG. 2 and comprises a conventional discriminator curve having a crossing at a reference voltage Vref when the IF picture carrier is at the proper IF frequency of 45.75 MHz.

Local oscillator 16 comprises a voltage controlled oscillator (VCO) which is controlled by a tuning voltage Vt. The tuning voltage Vt is developed by a buffer circuit 28 in response to the output of a push/pull driver 30. The push/pull driver 30 is in turn controlled by a phase detector 32 which compares the local oscillator frequency fLo divided by a prescaler 34 ($\div 64$) and a programmable divider 36 ($\div N$) with a reference frequency fref divided by a divisor M. Depending on the relationship between the output of programmable divider 36 (fLo/$2^P$N) and the divided reference frequency (fref/M), a first error signal is developed by phase detector 32 representing whether the divided local oscillator signal leads or lags the reference frequency and a second error signal is developed representing the amount of the lead or lag. The two error signals cause push/pull driver 30 to charge or discharge buffer 28 by an appropriate amount to vary the tuning voltage Vt until a local oscillator frequency fLo is developed corresponding to a selected channel index value N. At this point, tuning is effected to the nominal expected frequency of the channel corresponding to channel index N according to the relationship:

$$fLo = N(2^P fref/M).$$

If at this time, the picture carrier of the tuned signal is not at the nominal IF frequency of 45.75 MHz, the output of AFT detector 24 will cause the channel index N to be incremented or decremented thereby adjusting fLo until the AFT response is equal to Vref. As mentioned previously, in conventional systems this is done with a fixed step resolution of $2^P$Fref/M, which is typically 125 KHz.

According to the present invention, the output of AFT detector 24 is converted to a binary signal, e.g. in two's complement notation, by a slicer 44 and a quantizer 46 and applied to an input of a step direction/resolution generator 48. The output of step generator 48, which also receives an input from synch processor 26, comprises a step resolution value SR which is applied to a programmable reference divider 50 and to a channel index modifier 52. Channel index modifier 52 also receives a nominal channel index value from a channel index generator 54. Generator 54 is operated in response to a controller for providing a user selected channel index N. Programmable divider 50 is responsive to the step resolution value SR for deriving a division factor M1 and for dividing a reference frequency fref (e.g. 16 MHz) by factor M1 for developing an output signal fref/M1. This output signal is applied to a fixed reference divider 58 which further divides the signal by a fixed factor M2 and supplies the further divided signal to one input of phase detector 32. It will be appreciated that the combination of programmable divisor M1 and fixed divisor M2 comprise a combined divisor M so that the divided reference signal applied to phase detector 32 can be expressed as fref/M. Index modifier 52 is responsive to the step resolution value SR for deriving a modified channel index value N and for coupling the modified value to programmable divider 36. Divider 36 divides the output of prescaler 34 by the modified channel index value N and supplies the divided signal to the other input of phase detector 32.

The output of programmable reference divider 50 is also coupled to the clock input of a duration detector 31. Duration detector 31 is responsive to the second error signal developed by phase detector 32 for counting the number of pulses characterizing the output of reference divider 50 during each phase error interval of the second error signal to provide an output signal indicative of the amount of phase error between the two inputs to the phase detector. The count developed by duration detector 31 is accumulated by a sequential loop filter 33 in response to the first (lead/lag) error signal developed by the phase detector.

Figure 3:
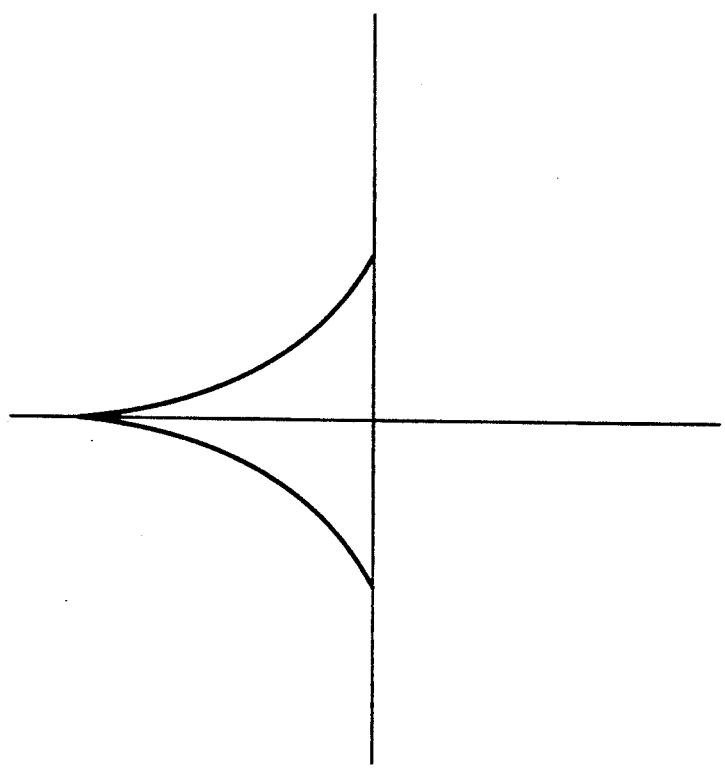
FIG. 3 illustrates the response of the GCR auto-correlator of the tuner of FIG. 1; and, FIG. 4 is a flow chart illustrating the operation of the AFT system of the tuner of FIG. 1.

Finally, the output of video detector 22 is applied to a GCR correlator 37 which provides an output as illustrated in FIG. 3 to another input of step resolution generator 48.

As will be explained in further detail below, the AFT system of the invention is initially operated in a coarse tuning mode after a selected channel is first tuned. In this mode, a maximum step resolution is used to allow for rapid adjustment of fLo. Thereafter, the step resolution is adaptively reduced as fLo approaches its proper frequency to provide a tuned signal having minimum frequency ripple.

Figure 4:
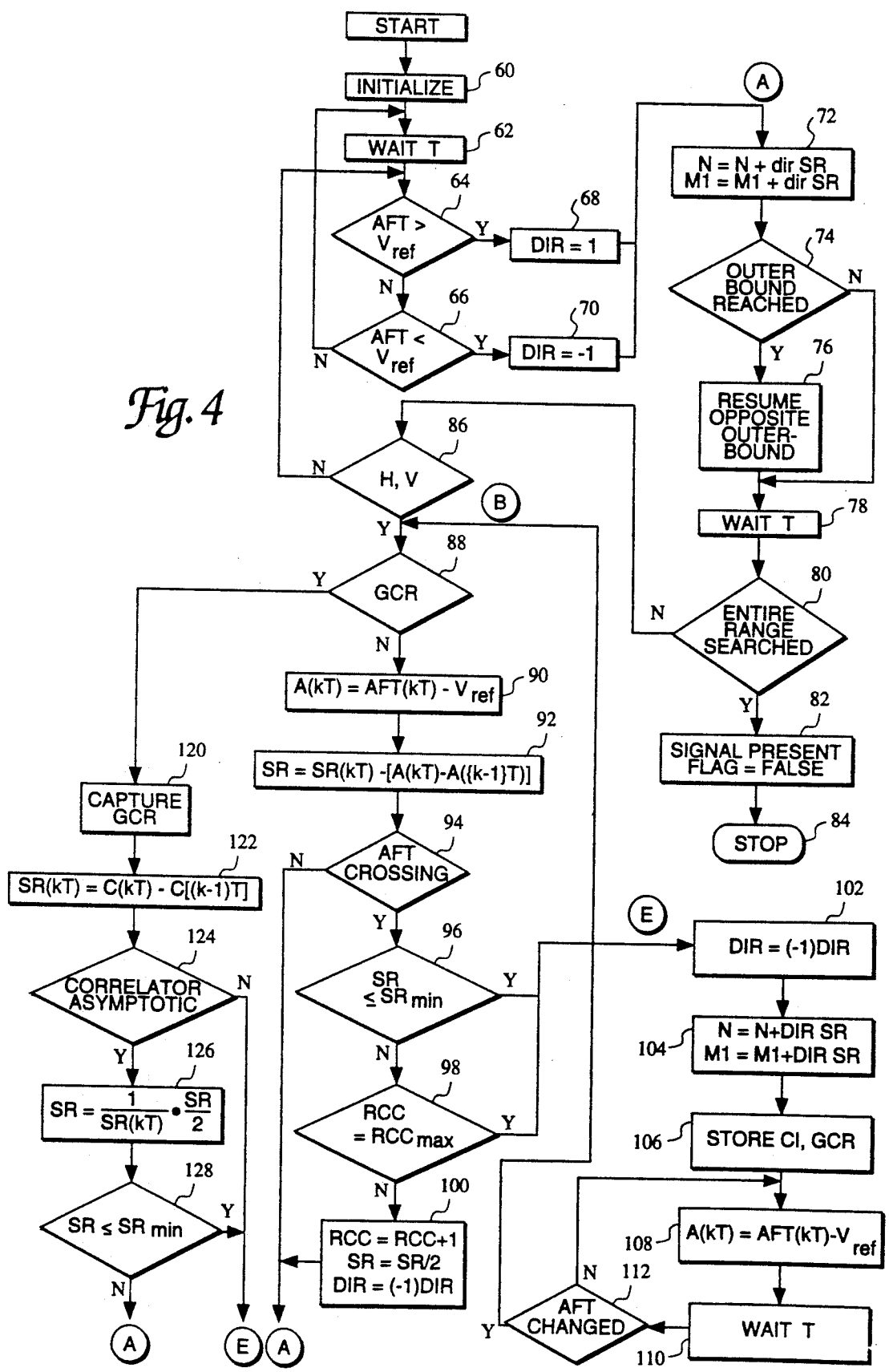

More specifically, referring to the flow chart of FIG. 4, a channel tuning operation begins as shown at block 60 by initializing variables and providing a nominal channel index value N and a nominal step resolution value SR. The tuning system will therefore initially tune the received signal from a selected direction to the nominal frequency of the selected channel in accordance with the initialized channel index and step resolution values N and SR. After waiting a predetermined period of time T as represented by block 62, the output of AFT detector 24 is checked as indicated at steps 64 and 66. If the AFT voltage is greater than Vref, fine tuning is required in a positive direction as represented by setting a direction flag DIR to "1" at step 68 and if the AFT voltage is less than Vref fine tuning is required in the opposite direction as represented by setting flag DIR to "−1" at step 70. If the AFT voltage is equal to Vref tuning is proper and no fine tuning is required as represented by returning to wait state 62.

In the fine tuning routine, the channel index N and divisor M1 are initially increased or decreased (depending on the polarity of flag DIR) by the initialized step resolution value SR in a step 72 to adjust the frequency fLo of local oscillator 16 in the appropriate direction for reducing the AFT error. Since the initialized value of the step resolution SR is relatively large, this initial stage of fine tuning will be performed relatively rapidly. Skipping for the moment steps 74–84, after waiting a time period T (step 78), the recovered video signal is examined in step 86 to determine whether horizontal and vertical synch have been detected. If not, indicating that tuning has not yet been sufficiently effected to recover synch or that no signal is being received on the channel, the AFT routine is repeated beginning at step 64. The loop comprising steps 64-86 is continuously repeated to adjust divisors N and M1 by the initialized value of step resolution SR until horizontal and vertical synch are detected at step 86, at which point, the AFT routine continues to a further routine in an attempt to more precisely adjust fLo relative to the received signal.

Further fine tuning is effected initially by checking for the presence of a GCR signal at a step 88. If a GCR signal is not present, a variable A (kt) representing the difference between the current AFT voltage and Vref is calculated in a step 90. Next, a new step resolution value SR is calculated in a step 92 by decreasing the current step resolution value SR by the difference between the current value of variable A(kt) and the previous value of the variable. Thus, the step resolution value SR is decreased by an amount directly related to the AFT error. That is, if the AFT error remains large (relative to its previous value) only a small (or no) reduction in step resolution is effected but, if the AFT error is substantially reduced a proportionately larger reduction is effected in step resolution value SR. In other words, the step resolution value is adaptively adjusted to effect fine tuning as a function of the rate of change of the AFT error.

After the new step resolution value has been calculated in step 92, the AFT response is checked in a step 94 to determine if Vref has been crossed. If it has not, the routine returns to step 72 where the new reduced step resolution value SR is used to appropriately adjust the channel index value N and divisor M1 for reducing the AFT error. The routine proceeds as before, further decreasing the step resolution value SR if necessary, until an AFT crossing is detected at step 94. At this point, the current step resolution value SR is checked to determine if it has reached a pre-programmed minimum level in a step 96 and a variable RCC (recurrent carrier crossing), which represents the number of times Vref of the AFT response has been crossed by the fine tuning routing, is checked in a step 98 to determine if it has reached a maximum value. Assuming that the tests performed in both steps 96 and 98 are negative, a step 100 is executed wherein variable RCC is incremented by one, the step resolution value SR is decreased by one-half, the flag DIR is changed in polarity and the routine returns to step 72. As a consequence, fine tuning will be effected in the opposite direction (remember that an AFT crossing was detected in step 94) with a reduced step resolution value until another AFT crossing is detected at step 94.

The foregoing routine is continuously repeated until either the minimum step resolution value has been reached (step 96) or the variable RCC has reached its maximum value (step 98). In either case, the routine proceeds to a steady state loop wherein the polarity of flag DIR is reversed in a step 102 and channel index value N and divisor M1 are accordingly adjusted in a step 104. Thereafter, the current channel index value N and the GCR state are stored for subsequent use by the tuning system as indicated at step 106. Finally, the current value of the AFT error voltage (i.e. variable A (kt)) is calculated in a step 108, the routine waits for a time interval T in step 110 and the state of the AFT error voltage is checked in a step 112. As long as the AFT error voltage does not change, the loop comprising steps 108-112 will be continuously executed thereby maintaining the steady state fine tuning resolution. If, for some reason, a change in the AFT error voltage is detected in step 112 the steady state loop is exited and the routine returns to step 88.

If a GCR signal is detected at step 88, the GCR signal (see FIG. 3) is used to adjust the step resolution value instead of the AFT error voltage (i.e. steps 90-100). The GCR signal is preferred for this purpose since its auto-correlation response is signal independent. In particular, the GCR signal, preferably a pseudo random code encoded in a selected line of the vertical blanking interval of the received signal, is initially captured in a step 120.

The auto-correlation response of the GCR signal is then used to derive a variable S(kt) corresponding to the slope of the response. Assuming that the correlation response is asymptotic (step 124) the step resolution value SR is reduced according to the expression given in a step 126 and the new value is checked to see if it has reached a pre-programmed minimum value in a step 128. If the minimum value has not been reached, the routine proceeds to step 72 where the new step resolution value SR is used to adjust the channel index value N and divisor M1 to appropriately adjust fine tuning. Once the minimum value of the step resolution value SR is reached in step 128, or the auto-correlation response becomes unasymptotic the steady state routine is accessed at step 102 as previously described.

Referring back to step 74, after each fine tuning adjustment in step 72 a test is performed to determine whether the AFT error voltage is in a so-called "outer-bound" region, i.e. the two shaded regions at the top and bottom of the AFT response curve of FIG. 2. If the AFT error voltage is in one of these two regions, fine tuning is adjusted in step 76 by attempting to tune the received signal from the opposite region. Also, after waiting for time interval T in step 78, a test is performed in step 80 to determine whether the fine tuning routine has searched a predetermined frequency range without detecting a received carrier. If so, a flag is set in a step 82 indicating that no signal is present in the channel and the AFT routine is stopped at step 84. Otherwise, the routine proceeds to step 86 as previously described.

It is recognized that those skilled in the art will readily perceive numerous additions and charges in the described embodiments of the invention without departing from its true spirit and scope. The invention is to be limited only as defined in the claims.

What is claimed is:

1. A method of tuning a received RF television signal comprising the steps of:
   generating a local oscillator signal for converting said received RF television signal to an intermediate frequency signal;
   generating a fixed reference signal;
   dividing the local oscillator and fixed reference signals by respective integer factors N and M;
   controlling the frequency of the local oscillator signal to minimize the frequency difference between the divided local oscillator and the divided fixed reference signals;
   initially selecting said factors N and M for adjusting the frequency of said local oscillator signal in steps of relatively course resolution for rapidly turning said RF television signal; and
   subsequently selecting said factors N and M for adjusting the frequency of said local oscillator signal in successive steps of adaptively increasing resolution for fine tuning said RF television signal.

2. The method of claim 1 including generating an autocorrelation signal in response to a reference signal comprising part of said received television signal and wherein said subsequent adjusting step comprises adjusting frequency of said local oscillator signal in response to said autocorrelation signal.

3. The method of claim 2 wherein said subsequent adjusting step comprises:
   deriving a series of decreasing step resolution values in response to the rate of change of said autocorrelation signal; and adjusting the frequency of said local oscillator signal in response to said series of decreasing step resolution values.

4. The method of claim 3 including terminating said subsequent adjusting step in response to reaching a predetermined minimum value of step resolution or detecting a non-asymptotic condition of said autocorrelation signal.

5. The method of claim 4 wherein said reference signal comprises a ghost cancellation reference signal encoded on one or more selected lines of the vertical blanking interval of said received television signal.

6. The method of claim 1 including determining the deviation of said intermediate frequency signal from a predetermined intermediate frequency and detecting whether said deviation has passed through a zero value condition.

7. The method of claim 6 wherein said subsequent adjusting step comprises:
deriving a series of decreasing step resolution values in response to the rate of change of said deviation; and
adjusting the frequency of said local oscillator signal in response to said series of decreasing step resolution values.

8. The method of claim 6 including initiating said subsequent adjusting step in response to said deviation passing through said zero value condition a first time.

9. The method of claim 8 including terminating said subsequent adjusting step in response to reaching a predetermined minimum value of step resolution or detecting that said deviation has passed through said zero value condition a predetermined number of times.

10. A tuning system for a television receiver comprising:
means for generating a local oscillator signal for converting a received RF signal to an intermediate frequency signal;
means for generating a control signal representing the deviation of said intermediate frequency signal from a predetermined condition;
first programmable divider means for dividing said local oscillator signal by a first divisor nominally representing a selected channel for providing a divided local oscillator signal;
second programmable divider means for dividing a reference signal by a second divisor for providing a divided reference signal;
comparator means for generating an error signal controlling the local oscillator signal for minimizing the difference between said divided local oscillator signal and said divided reference signal; and
means for generating a series of step resolution signals having values which adaptively vary as a function of said error and control signals, said first and second programmable divider means being responsive to said series of step resolution signals for respectively adjusting said first and second divisors for fine tuning said received RF signal.

11. The system of claim 10 wherein said control signal comprises an AFT signal representing the frequency deviation of said converted signal from a predetermined intermediate frequency, said step resolution signal generating means being responsive to said AFT signal for operating said first and second programmable divider means for providing respective divided local oscillator and reference signals adapted for operating said comparator means for rapidly adjusting the frequency of said local oscillator signal to minimize said frequency deviation.

12. The system of claim 11 wherein said control signal comprises a detection signal developed in response to said received RF signal having been tuned with a predetermined degree of accuracy, said step resolution signal generating means being responsive to said detection signal for operating said first and second divider means for providing respective divided local oscillator and reference signals adapted for operating said comparator means for adjusting the frequency of said local oscillator signal in successive steps of adaptively increasing resolution.

13. The system of claim 12 wherein said step resolution signal generating means is responsive to said detection signal and the rate of change of said deviation for adjusting the frequency of said local oscillator signal in said successive steps of adaptively increasing resolution.

14. The system of claim 12 including means for generating an autocorrelation signal in response to a reference signal comprising part of said received RF signal and wherein said step resolution signal generating means is responsive to said detection signal and the rate of change of said auto correlation signal for adjusting the frequency of said local oscillator signal in said successive steps of adaptively increasing resolution.

15. The system of claim 14 wherein said reference signal comprises a ghost cancellation reference signal encoded on one or more lines of the vertical blanking interval of said received signal.

16. The system of claim 10 wherein said second programmable divider means comprises a programmable divider responsive to said step resolution signals for dividing said reference signal to develop an intermediate divided signal and a fixed divider for dividing said intermediate divided signal for providing said divided reference signal.

17. The system of claim 16 including means responsive to said comparator means for counting said intermediate divided signal for accumulating a count representing the time integrated value of said error signal and means for coupling said count to said step resolution signal generating means.

18. A tuning system for a television receiver comprising:
means for generating a local oscillator signal for converting a received RF television signal to an intermediate frequency signal;
means for developing an AFT error signal representing the deviation of said intermediate frequency signal from a predetermined intermediate frequency;
first programmable divider means for dividing said local oscillator signal by a first divisor nominally representing a selected channel for providing a divided local oscillator signal;
second programmable divider means for dividing a fixed reference signal by a second divisor for providing a divided reference signal;
comparator means for generating an error signal controlling the local oscillator signal for minimizing the difference between said divided local oscillator signal and said divided reference signal; and
means responsive to said AFT error signal for adjusting said first and second divisors in a coordinated manner for initially adjusting the frequency of said local oscillator signal in steps of relatively course resolution for rapidly minimizing said deviation and subsequently further adjusting the frequency of said local oscillator signal in successive steps of adaptively increasing resolution until a predetermined tuning condition has been achieved.

19. The tuning system of claim 18 including means for generating an autocorrelation signal in response to a reference signal comprising part of said received television signal, said fine tuning means adjusting the frequency of said local oscillator signal in said successive steps of adaptively increasing resolution in response to said autocorrelation signal.

20. The tuning system of claim 19 wherein said reference signal comprises a ghost cancellation reference signal encoded in one or more selected lines of the vertical blanking interval of said received television signal.

21. The tuning system of claim 19 wherein said fine tuning means is responsive to said AFT error signal passing through a zero value condition for adjusting the frequency of said local oscillator in said steps of adaptively increasing resolution.

22. Apparatus for tuning a receiver to a selected RF carrier comprising:
   means for generating a local oscillator signal for converting said RF carrier to an intermediate frequency signal;
   means for generating a fixed frequency reference signal;
   first and second divider means for respectively dividing said local oscillator and reference signals by respective programmable divisors N and M;
   comparison means controlling said local oscillator signal generating means for minimizing the difference between said divided local oscillator and divided reference signals; and
   control means responsive to said intermediate frequency signal for generating a step resolution signal, said first and second divider means being responsive to said step resolution signal for respectively adjusting the values of N and M in a coordinated manner.

23. The apparatus of claim 22 wherein said first and second divider means are responsive to said step resolution signal for respectively adjusting the values of N and M for initially generating said local oscillator signal in steps of relatively course resolution and for subsequently generating said local oscillator signal in steps of increasing resolution as said intermediate frequency signal approaches a predetermined tuning condition.

24. The apparatus of claim 23 including means for generating an auto correlation signal in response to a received reference signal, said control means being responsive to said autocorrelation signal for generating said step resolution signal.

25. The apparatus of claim 23 wherein said control means comprises means for generating an AFT error signal representing the deviation of said intermediate frequency signal from a predetermined intermediate frequency and means responsive to said AFT error signal for generating said step resolution signal.

26. The apparatus of claim 25 wherein said means responsive to said AFT error signal comprises means for detecting the first time said AFT error signal passes through a zero value condition for initiating generation of said local oscillator signal in said steps of increasing resolution.

* * * * *